US011272609B2

(12) United States Patent
Koshio

(10) Patent No.: US 11,272,609 B2
(45) Date of Patent: Mar. 8, 2022

(54) CIRCUIT BOARD AND ELECTRONIC DEVICE

(71) Applicant: Panasonic Intellectual Property Management Co., Ltd., Osaka (JP)

(72) Inventor: Yohei Koshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/944,276

(22) Filed: Jul. 31, 2020

(65) Prior Publication Data

US 2020/0367356 A1 Nov. 19, 2020

Related U.S. Application Data

(63) Continuation of application No. PCT/JP2018/048012, filed on Dec. 27, 2018.

(30) Foreign Application Priority Data

Feb. 15, 2018 (JP) .............................. JP2018-025297

(51) Int. Cl.
*H05K 1/02* (2006.01)
*H05K 1/18* (2006.01)
*G06F 1/18* (2006.01)

(52) U.S. Cl.
CPC ......... *H05K 1/0225* (2013.01); *H05K 1/0215* (2013.01); *H05K 1/18* (2013.01); *G06F 1/184* (2013.01); *H05K 2201/062* (2013.01); *H05K 2201/10409* (2013.01)

(58) Field of Classification Search
CPC .................. H05K 1/02; H05K 1/0203; H05K 1/0215–0225; H05K 1/0253; H05K 1/18;

(Continued)

(56) References Cited

U.S. PATENT DOCUMENTS 4,851,614 A * 7/1989 Duncan, Jr. .......... H05K 1/0215
174/263
6,295,210 B1 * 9/2001 Lanzone .............. H05K 1/0215
174/263

(Continued)

FOREIGN PATENT DOCUMENTS

JP 2010-050298 A 3/2010
JP 2010-199553 A 9/2010

(Continued)

OTHER PUBLICATIONS

International Search Report for related Application No. PCT/JP2018/048012, dated Mar. 19, 2019.

*Primary Examiner* — Tuan T Dinh
(74) *Attorney, Agent, or Firm* — Renner, Otto, Boisselle & Sklar, LLP

(57) ABSTRACT

A circuit board is a circuit board on which a predetermined circuit unit that causes heat and electromagnetic noise is disposed, and which is to be fixed to a conductive housing with a conductive screw. The circuit board includes: an insulator layer including an insulating plate-shaped base material; a conductor layer having a circuit pattern including a ground portion, which is disposed on at least one surface of the insulator layer; and a screw insertion hole that penetrates the insulator layer and the ground portion, and through which the conductive screw is to be inserted. The ground portion has a slit disposed between the screw insertion hole and the predetermined circuit unit. The ground portion has a ground bridge that electrically connects a portion of the ground portion between the slit and the screw insertion hole and a portion of the ground portion between the slit and the predetermined circuit unit.

16 Claims, 10 Drawing Sheets

(58) Field of Classification Search
CPC ..... H05K 1/181–187; H05K 2201/062; H05K 2201/09663; H05K 2201/16409; H05K 7/00–06; H05K 9/00; H05K 9/02; H05K 9/04; G06F 1/203; G06F 1/626; G06F 1/656
USPC ................ 361/752–759, 807–810, 816, 818; 174/177, 350, 258–264
See application file for complete search history.

(56) References Cited

U.S. PATENT DOCUMENTS

| | | | | |
|---|---|---|---|---|
| 7,088,591 | B2* | 8/2006 | Kishimoto | H05K 1/0215 |
| | | | | 29/846 |
| 7,898,820 | B2* | 3/2011 | Kao | H05K 1/116 |
| | | | | 361/807 |
| 8,766,099 | B2* | 7/2014 | Yeates | H05K 1/0271 |
| | | | | 174/254 |
| 2008/0074857 | A1* | 3/2008 | Funato | H05K 9/0039 |
| | | | | 361/818 |
| 2009/0086450 | A1* | 4/2009 | Matsui | H05K 3/4691 |
| | | | | 361/761 |
| 2011/0141707 | A1* | 6/2011 | Hasegawa | H05K 5/0247 |
| | | | | 361/753 |
| 2011/0247869 | A1 | 10/2011 | Koyama | |
| 2011/0310574 | A1 | 12/2011 | Nomoto | |

FOREIGN PATENT DOCUMENTS

| | | |
|---|---|---|
| JP | 2011-211147 A | 10/2011 |
| JP | 2012-001105 A | 1/2012 |
| JP | 2015-111093 A | 6/2015 |

* cited by examiner

CIRCUIT BOARD AND ELECTRONIC DEVICE

TECHNICAL FIELD

The present disclosure relates to a circuit board and an electronic device including the circuit board.

BACKGROUND ART

PTL 1 discloses, in a circuit board on which a sensor and an electronic component are mounted, a structure in which a slit is formed, the slit blocking heat caused in the electronic component from being conducted to the sensor.

CITATION LIST

Patent Literature

PTL 1: Unexamined Japanese Patent Publication No. 2015-111093

SUMMARY

An object of the present disclosure is to suppress, in a circuit board to be fixed to a housing of a device and in an electronic device including the circuit board, occurrence of electromagnetic noise due to a predetermined circuit unit on the circuit board while suppressing conduction of heat caused in the predetermined circuit unit to a housing of the device.

In the present disclosure, there is provided a circuit board in which a predetermined circuit unit that causes heat and electromagnetic noise is disposed, and which is to be fixed to a conductive housing with a conductive screw.

The circuit board includes:

an insulator layer including an insulating plate-shaped base material;

a conductor layer that is disposed on at least one surface of the insulator layer and that has a circuit pattern including a ground portion; and a screw insertion hole that penetrates the insulator layer and the ground portion and through which a screw is to be inserted.

The ground portion has a slit disposed between the screw insertion hole and the predetermined circuit unit.

The ground portion has a ground bridge that electrically connects a portion of the ground portion between the slit and the screw insertion hole and a portion of the ground portion between the slit and the predetermined circuit unit.

In the present disclosure, there is provided an electronic device including the circuit board of the present disclosure and the housing.

According to the present disclosure, occurrence of electromagnetic noise due to a predetermined circuit unit on a circuit board can be suppressed while suppressing conduction of heat caused in the predetermined circuit unit to a housing.

DESCRIPTION OF EMBODIMENTS

Hereinafter, exemplary embodiments will be described in detail with reference to the drawings as appropriate. However, more detailed description than necessary may be omitted. For example, detailed description of already well-known matters and duplicate description of substantially the same configurations may be omitted. This is to avoid unnecessary redundancy in the following description and to facilitate understanding by those skilled in the art.

It should be noted that the inventor provides the accompanying drawings and the following description for those skilled in the art to fully understand the present disclosure, which are not intended to limit the subject matters described in the claims.

First Exemplary Embodiment

Hereinafter, a first exemplary embodiment will be described with reference to the drawings.

[1-1. Configuration, Etc.]

Figure 1:
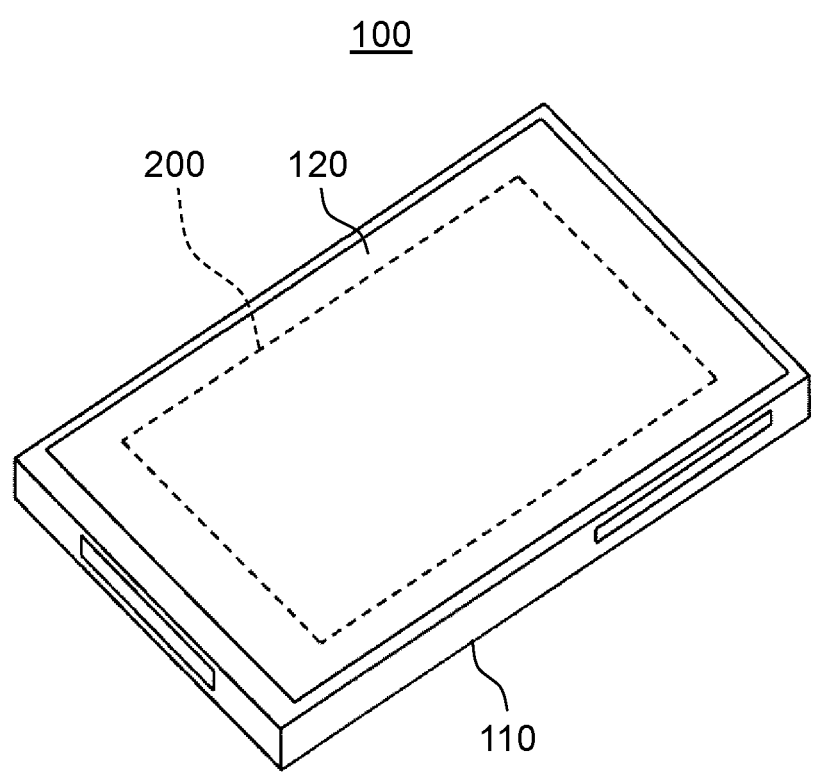
FIG. 1 is a perspective view of a computer including a circuit board according to a first exemplary embodiment.

FIG. 1 is a perspective view of a computer including a circuit board according to the first exemplary embodiment. Computer 100 is one example of an electronic device according to the present disclosure.

Computer 100 includes housing 110, display unit 120, and circuit board 200.

Housing 110 is formed by using a conductive metal or an alloy such as a magnesium alloy.

Display unit 120 displays images and videos. Display unit 120 is configured by, for example, a liquid crystal display or an organic electroluminescence (EL) display. Display unit 120 may include a touch panel.

Circuit board 200 is arranged in housing 110.

Figure 2:
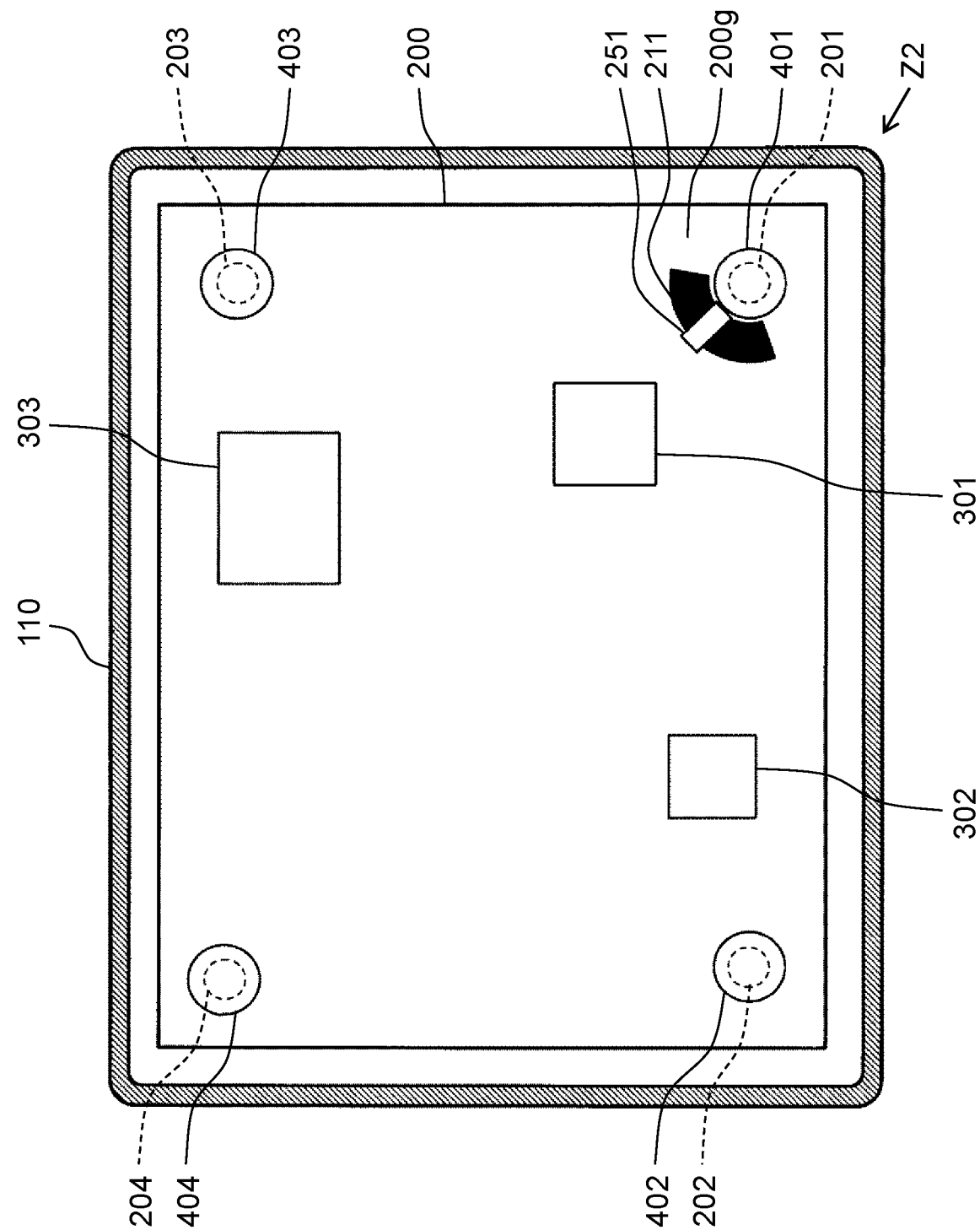
FIG. 2 is a plan view schematically showing the circuit board disposed in a housing.

FIG. 2 is a plan view schematically showing circuit board 200 disposed in housing 110.

On circuit board 200, various components including circuit units 301, 302, 303, each configured by one or more electronic components, and others are mounted. Also, in circuit board 200, a circuit pattern including wiring, a ground portion, etc., is formed. The circuit pattern is formed of, for example, a copper foil. Note that the wiring is omitted. Of circuit units 301, 302, 303, circuit unit 301 is assumed to cause a relatively large amount of heat during its operation. Circuits and components other than circuit units 301, 302, 303 are not shown.

Circuit unit 301 is a power supply circuit and is one example of the predetermined circuit unit. The power supply circuit is, for example, an AC/DC converter or a DC/DC converter, and is configured by using a transistor, an integrated circuit, a capacitor, and the like. The power supply circuit is driven at a drive frequency of several hundred MHz, and becomes a heat source that causes a relatively large amount of heat due to power conversion loss, etc., during its operation. Additionally, the power supply circuit becomes a source that causes electromagnetic noise (electromagnetic interference (EMI) Noise) by being driven at the high frequency as described above.

Circuit unit 301 as the predetermined circuit unit in the present disclosure may be an arithmetic processing circuit such as a central processing unit (CPU) or a micro processing unit (MPU). The arithmetic processing circuit is driven at a drive frequency of, for example, several GHz, consumes a large amount of power during its operation, and becomes a heat source that causes a relatively large amount of heat. Also, the arithmetic processing circuit becomes a source that causes EMI noise by being driven at the high frequency as described above.

Circuit board 200 shown in FIG. 2 has a rectangular shape, and has screw insertion holes 201, 202, 203, 204 near four corners of the rectangle. Circuit board 200 is fixed to housing 110 by using screws 401, 402, 403, 404.

Figure 3:
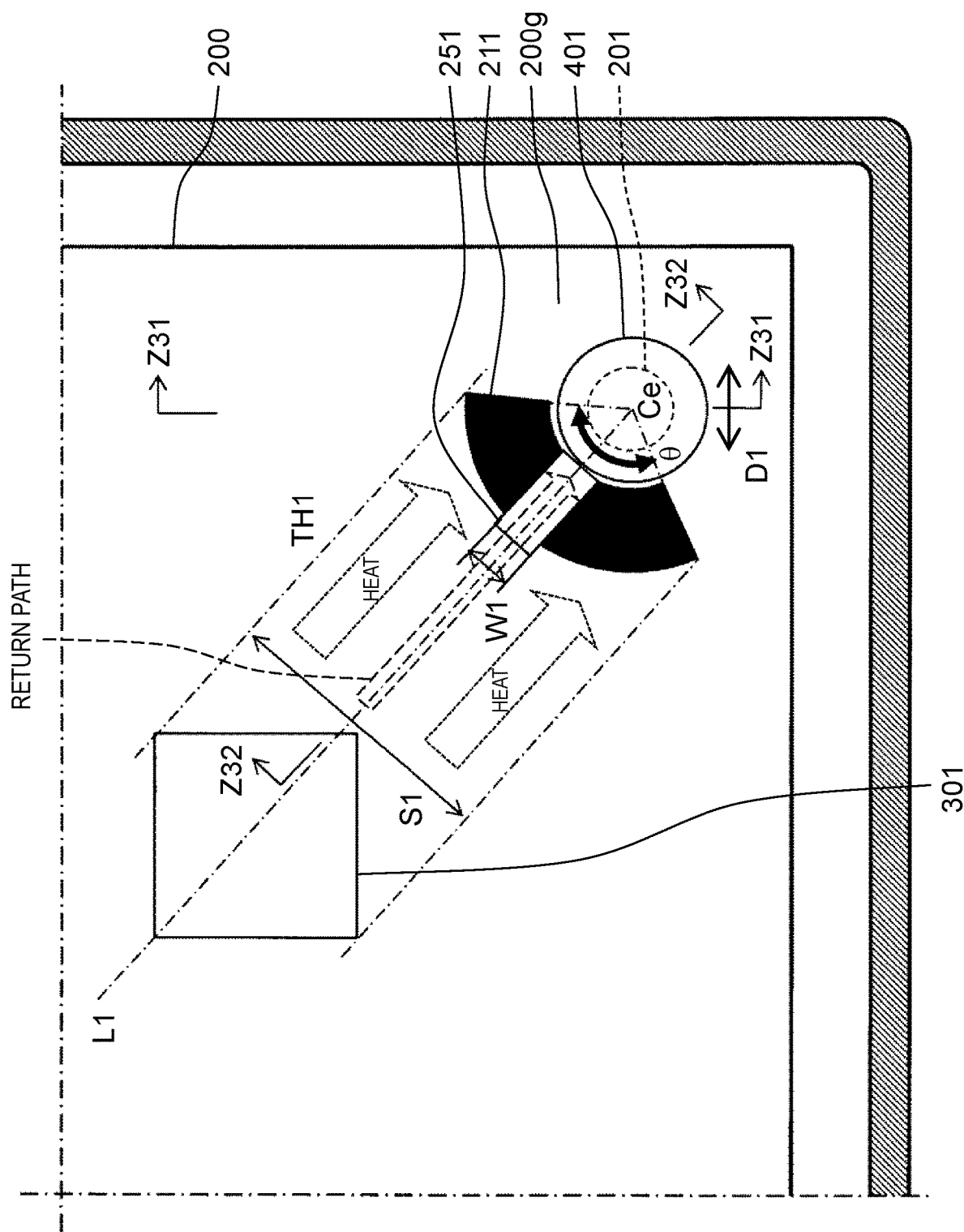
FIG. 3 is an enlarged view of a portion indicated by arrow Z2 in FIG. 2.
Figure 4:
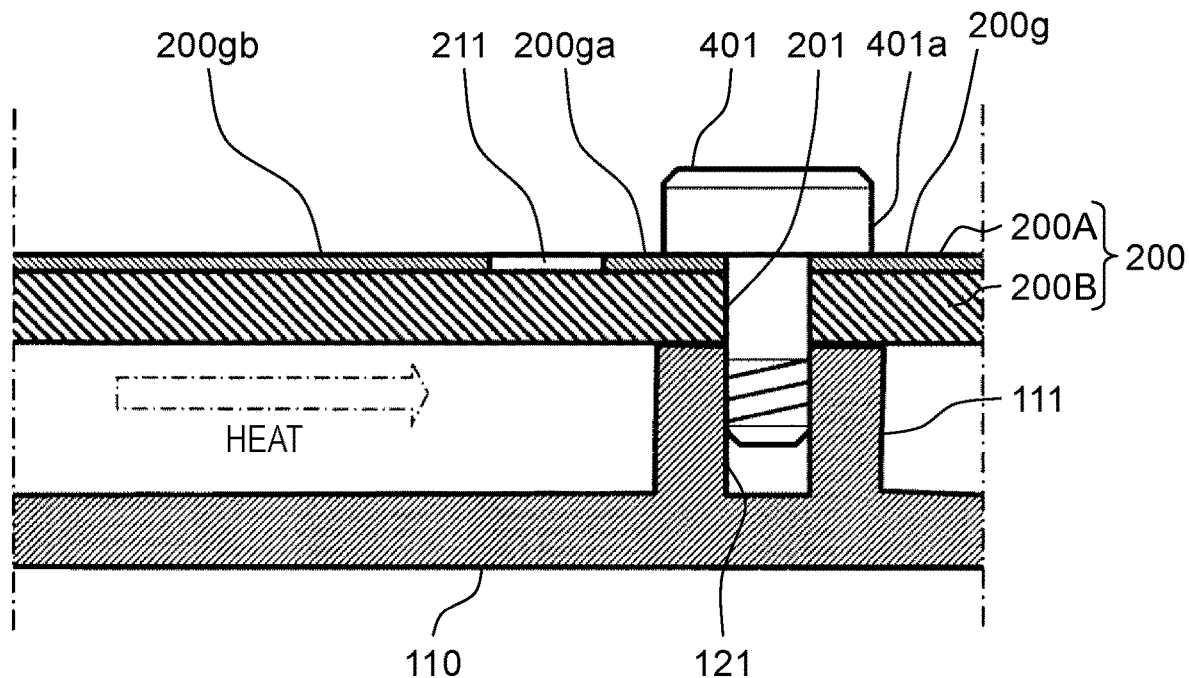
FIG. 4 is a sectional view taken along line Z31-Z31 in FIG. 3.
Figure 5:
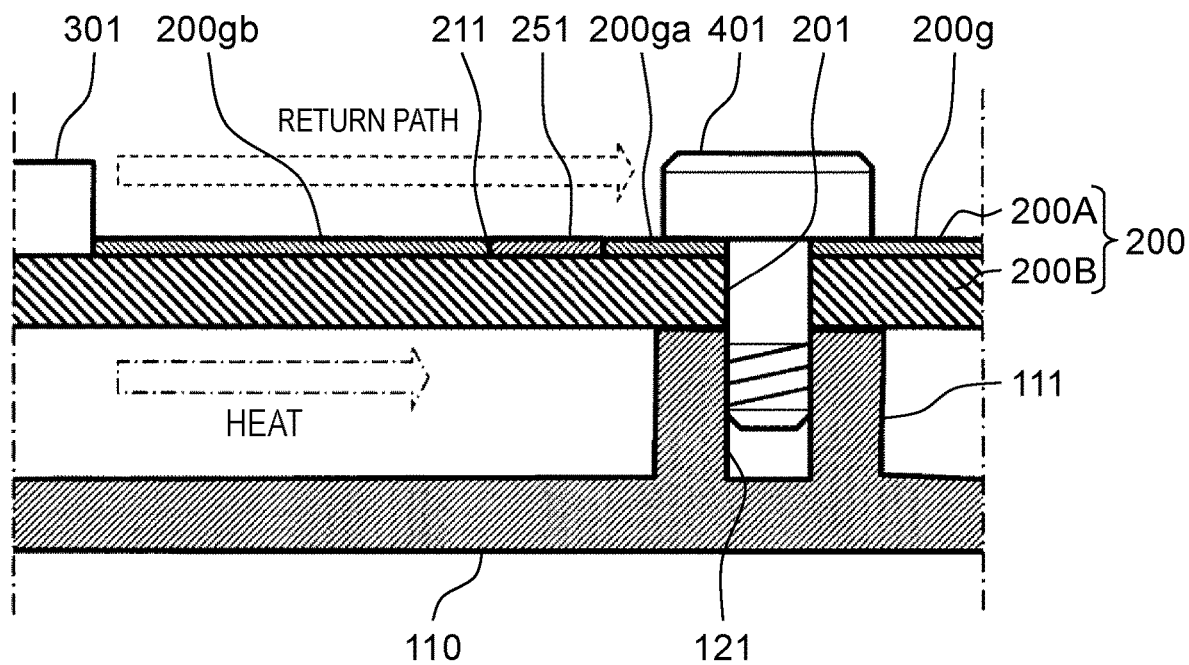
FIG. 5 is a sectional view taken along line Z32-Z32 in FIG. 3.

FIG. 3 is an enlarged view of a portion indicated by arrow Z2 in FIG. 2. FIG. 4 is a sectional view taken along line Z31-Z31 in FIG. 3. FIG. 5 is a sectional view taken along line Z32-Z32 in FIG. 3.

As shown in FIG. 4, circuit board 200 includes insulator layer 200B formed of an insulating plate-shaped base material, and conductor layer 200A formed, on one surface of insulator layer 200B, of a conductor such as a copper foil. In conductor layer 200A, a circuit pattern having a signal line and ground portion 200g is formed. Here, ground portion 200g is a conductor such as a copper foil and functions as a ground when computer 100 operates. In FIG. 4, only ground portion 200g of the circuit pattern in conductor layer 200A is shown.

As shown in FIG. 4, screw insertion hole 201 through which screw 401 is to be inserted is formed in circuit board 200. Screw insertion hole 201 is formed to penetrate insulator layer 200B and ground portion 200g of conductor layer 200A. A tip of screw 401 inserted through screw insertion hole 201 is screwed into screw hole 121 of boss 111 provided on an inner surface of housing 110. At this time, circuit board 200 is sandwiched between a seat surface of head 401a of screw 401 and a top surface of boss 111 to be fixed to housing 110, and the seat surface of head 401a of screw 401 is pressed against ground portion 200g. Screw 401 is conductive screw 401 made of a metal or the like. Thereby, when circuit board 200 is fixed to housing 110, ground portion 200g and housing 110 are electrically connected via screw 401.

As described above, circuit unit 301 causes a relatively large amount of heat. The heat caused in circuit unit 301 is conducted to screw 401 via circuit board 200 and further conducted to housing 110 via screw 401. Therefore, in housing 110, a temperature of an outer surface of the housing near screw 401 is relatively higher than that of a surrounding area, and a user who touches the outer surface of the housing may feel uncomfortable.

To address this problem, in circuit board 200 of the present exemplary embodiment, ground portion 200g around screw insertion hole 201 has slit 211 such that the temperature of the outer surface of the housing near boss 111 is not increased to a predetermined temperature or higher. Slit 211 is disposed between screw insertion hole 201 and circuit unit 301. The predetermined temperature is a temperature at which the user who touches the outer surface of the housing is not likely to feel uncomfortable.

As shown in FIG. 3, slit 211 has an arc shape (fan shape) centered on center Ce of screw insertion hole 201. Angular range θ of the arc of slit 211 is set based on arrival path TH1 for heat from circuit unit 301 to screw insertion hole 201 so as to block heat conduction from circuit unit 301 to screw insertion hole 201 via ground portion 200g. Arrival path TH1 is assumed, for example, to have constant width S1 on both sides of virtual line L1 that connects the center of circuit unit 301 and center Ce of screw insertion hole 201. In this case, width S1 is, for example, a length of arrival path TH1 in a direction perpendicular to virtual line L1 in circuit unit 301. Additionally, angular range θ of slit 211 is about 120°. The width of arrival path TH1 may be appropriately changed according to the amount of heat caused by circuit unit 301.

Here, when slit 211 is formed in ground portion 200g of circuit board 200, a return path for a ground current of circuit unit 301 to housing 110 becomes a path that bypasses slit 211. Therefore, the return path becomes longer than when slit 211 is not formed. Therefore, electromagnetic noise due to circuit unit 301 is likely to occur (increase).

In order to solve this, in the present exemplary embodiment, circuit board 200 is configured as follows. That is, as shown in FIG. 5, ground portion 200g has ground bridge 251 that electrically connects portion 200ga and portion 200gb. Here, portion 200ga is a portion of ground portion 200g between slit 211 and screw insertion hole 201. Portion 200gb is a portion of ground portion 200g between slit 211 and circuit unit 301. Ground bridge 251 is formed of a conductor such as a copper foil.

As shown in FIG. 3, ground bridge 251 is provided on virtual line L1 that connects circuit unit 301 and screw insertion hole 201. Thereby, the ground current of circuit unit 301 can reach screw 401 via ground bridge 251 without bypassing slit 211. That is, the return path for the ground current of circuit unit 301 can be shortened. Therefore, occurrence (increase) of electromagnetic noise due to circuit unit 301 can be suppressed even when slit 211 is provided.

Width W1 of ground bridge 251 is set to be as small as possible within a range in which the electromagnetic noise in the MHz band caused by circuit unit 301 is suppressed by a certain amount. The reason why width W1 is set to be as small as possible in this way is because heat conduction to screw 401 via ground bridge 251 is suppressed as much as possible. In order to suppress electromagnetic noise in the MHz band, width W1 of ground bridge 251 is set to, for example, about 1 mm. Width W1 of ground bridge 251 may be smaller than diameter D1 of screw insertion hole 201.

Figure 6:
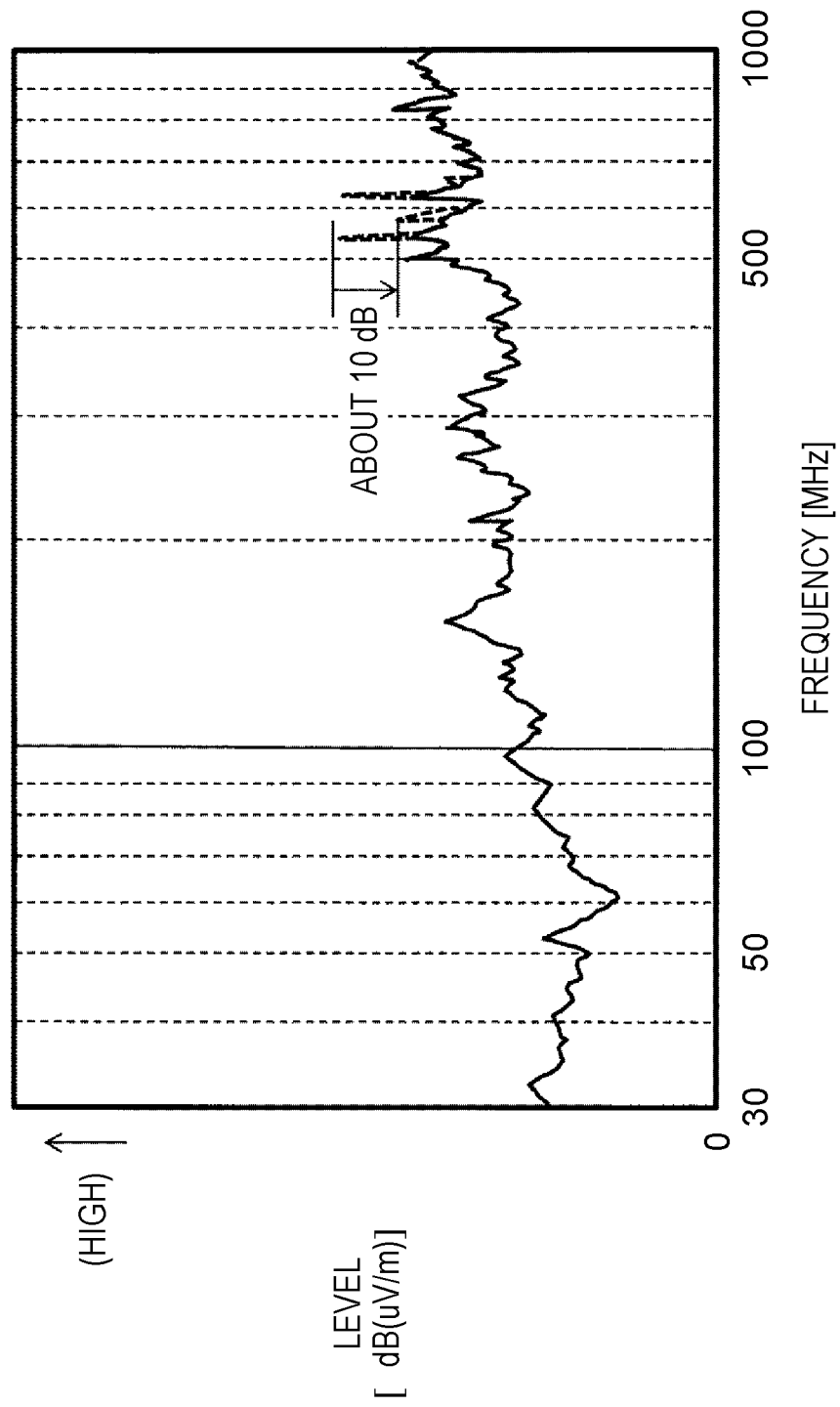
FIG. 6 is a graph showing results of measuring electromagnetic noise.

FIG. 6 is a graph showing results of measuring electromagnetic noise.

The solid line shows a frequency characteristic of an electromagnetic noise level when ground bridge 251 is provided, and the broken line shows a frequency characteristic of an electromagnetic noise level when ground bridge 251 is not provided. Note that the broken line, when ground bridge 251 is not provided, shows only portions where a significant difference exists compared to when ground bridge 251 is provided. These characteristics were measured according to a predetermined measurement method defined by VCCI. When ground bridge 251 was provided, a peak of the electromagnetic noise level particularly included in a range of 500 MHz to 700 MHz could be reduced by about 10 dB compared to when ground bridge 251 was not provided.

As described above, according to circuit board 200 and computer 100 of the present exemplary embodiment, occurrence (increase) of electromagnetic noise due to circuit unit 301 on circuit board 200 can be suppressed while suppressing the conduction of the heat caused in circuit unit 301 to housing 110.

[1-2. Effects, Etc.]

Circuit board 200 according to the present exemplary embodiment is circuit board 200 in which circuit unit 301 (one example of the predetermined circuit unit) that causes heat and electromagnetic noise is disposed, and which is to be fixed to conductive housing 110 with conductive screw 401.

Circuit board 200 includes:
insulator layer 200B including an insulating plate-shaped base material;
conductor layer 200A that is disposed on at least one surface of insulator layer 200B and that has a circuit pattern including ground portion 200g; and
screw insertion hole 201 that penetrates insulator layer 200B and ground portion 200g and through which screw 401 is to be inserted.

Ground portion 200g has slit 211 disposed between screw insertion hole 201 and circuit unit 301.

Ground portion 200g has ground bridge 251 that electrically connects portion 200ga of ground portion 200g between slit 211 and screw insertion hole 201 and portion 200gb of ground portion 200g between slit 211 and circuit unit 301.

Thereby, occurrence (increase) of electromagnetic noise due to circuit unit 301 on circuit board 200 can be suppressed while suppressing the conduction of the heat caused in circuit unit 301 to housing 110.

In circuit board 200 of the present exemplary embodiment, ground bridge 251 is provided on virtual line L1 that connects circuit unit 301 and screw insertion hole 201.

Thereby, a return path for a ground current from circuit unit 301 to screw insertion hole 201 can be shortened. Therefore, occurrence (increase) of electromagnetic noise due to circuit unit 301 can be effectively suppressed.

In circuit board 200 of the present exemplary embodiment, slit 211 has an arc shape centered on center Ce of screw insertion hole 201.

Angular range θ of the arc shape is set based on arrival path TH1 (conduction path) for heat from circuit unit 301 to screw insertion hole 201 so as to block the heat caused by circuit unit 301 from being conducted to screw insertion hole 201 via ground portion 200g.

Thereby, the heat conduction from circuit unit 301 to screw insertion hole 201 via ground portion 200g can be appropriately blocked according to the arrival path for heat from circuit unit 301 to screw insertion hole 201.

In circuit board 200 of the present exemplary embodiment, circuit unit 301 is a power supply circuit (one example of the predetermined circuit unit).

Thereby, occurrence (increase) of electromagnetic noise caused by the power supply circuit can be suppressed while suppressing the conduction of the heat caused in the power supply circuit to housing 110. Among circuits and electronic components disposed on circuit board 200, the power supply circuit causes a relatively large amount of heat and is likely to cause electromagnetic noise. The above effects can be obtained with such a power supply circuit.

Circuit unit 301 may be an arithmetic processing circuit (one example of the predetermined circuit unit).

Thereby, occurrence (increase) of electromagnetic noise caused by the arithmetic processing circuit can be suppressed while suppressing conduction of heat caused in the arithmetic processing circuit to housing 110. Among circuits and electronic components arranged on the circuit board 200, the arithmetic processing circuit causes a relatively large amount of heat and is likely to cause electromagnetic noise. The above effects can be obtained with such an arithmetic processing circuit.

Computer 100 (one example of the electronic device) of the present exemplary embodiment includes
circuit board 200, and
housing 110.

Thereby, in computer 100, occurrence (increase) of electromagnetic noise due to circuit unit 301 on circuit board 200 can be suppressed while suppressing the conduction of the heat caused in circuit unit 301 to housing 110.

Second Exemplary Embodiment

A second exemplary embodiment will be described focusing on differences from first exemplary embodiment.

[2-1. Configuration, Etc.]

Figure 7:
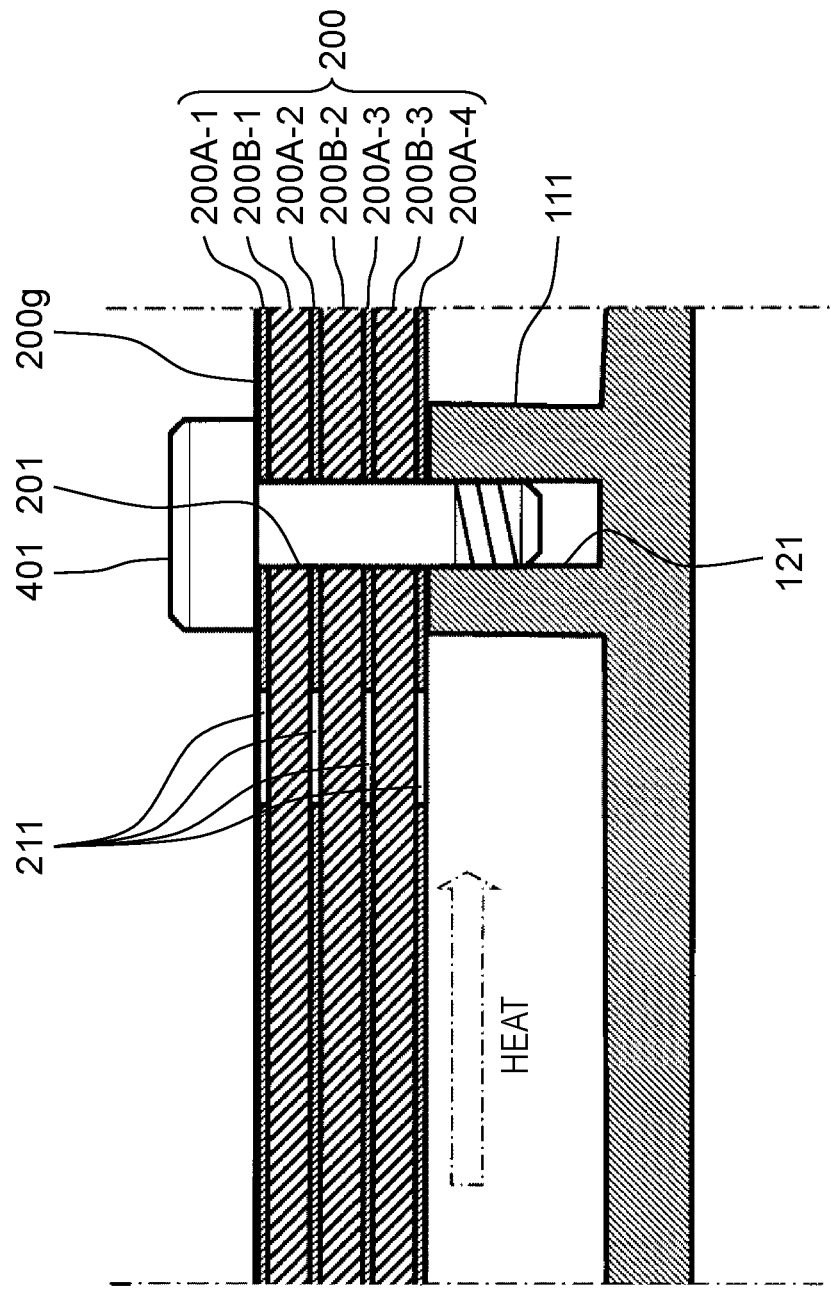
FIG. 7 is a sectional view of a computer including a circuit board according to a second exemplary embodiment, the view corresponding to FIG. 4.
Figure 8:
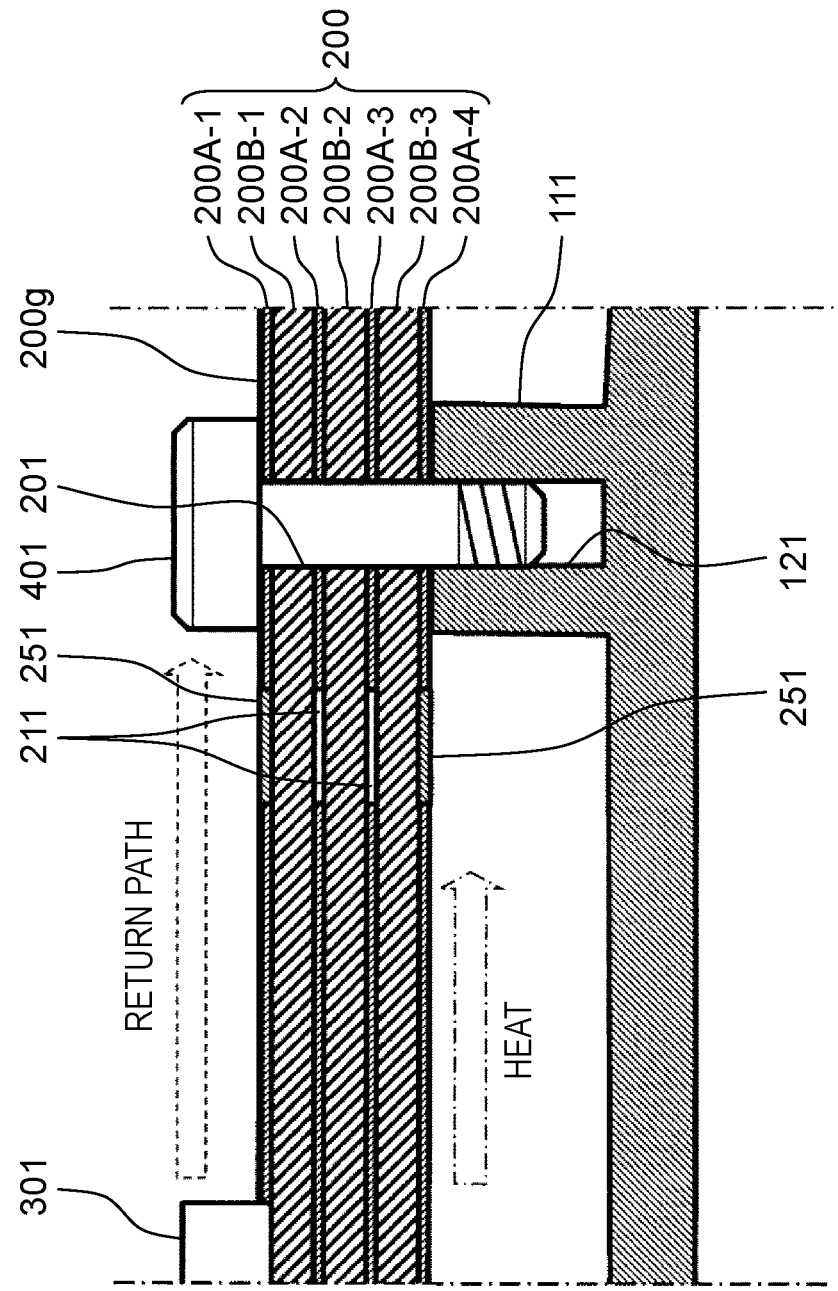
FIG. 8 is a sectional view of the computer including the circuit board according to the second exemplary embodiment, the view corresponding to FIG. 5.

FIG. 7 is a sectional view of a computer including a circuit board according to the second exemplary embodiment, the view corresponding to FIG. 4. FIG. 8 is a sectional view of the computer including the circuit board according to second exemplary embodiment, the view corresponding to FIG. 5.

In circuit board 200 according to the present exemplary embodiment, a plurality of conductor layers 200A and a plurality of insulator layers 200B are alternately provided. FIG. 8 shows an example in which three insulator layers 200B-1, 200B-2, 200B-3 and four conductor layers 200A-1, 200A-2, 200A-3, 200A-4 are provided. Slit 211 is formed in each of ground portions 200g of four conductor layers 200A-1, 200A-2, 200A-3, 200A-4. Ground portions 200g of respective conductor layers 200A-1, 200A-2, 200A-3, 200A-4 are connected to each other via through-hole vias (not shown) or the like. Additionally, as shown in FIG. 8, ground bridges 251 are provided, of slits 211 of conductor layers 200A-1, 200A-2, 200A-3, 200A-4, only for slit 211 of conductor layer 200A-1 that forms one surface of circuit board 200 and for slit 211 of conductor layer 200A-4 that forms the other surface of circuit board 200. Ground bridges can be provided for all slits 211, but in order to reduce the heat conduction to housing 110 via ground bridges 251, ground bridges 251 are provided only for the above two layers. Note that providing ground bridges only in two layers is one example, and ground bridge(s) may be provided in only one layer or in three or more layers. Alternatively, ground bridges may be provided in any conductor layers including an intermediate conductor layer, instead of the conductor layers that form one surface and the other surface as described above. Which conductor layers are provided with the ground bridges may be set in consideration of the balance between heat and magnitude of electromagnetic noise.

According to the present exemplary embodiment, the ground current of circuit unit 301 can reach screw 401 via two ground bridges 251 in the one surface and the other surface. Therefore, occurrence of electromagnetic noise due to circuit unit 301 can be suppressed more effectively even when slits 211 are provided.

According to the present exemplary embodiment, circuit board 200 is configured as described above. Thereby, in computer 100, occurrence (increase) of electromagnetic noise due to circuit unit 301 on circuit board 200 can be suppressed while suppressing the conduction of the heat caused in circuit unit 301 to housing 110.

[2-2. Effects, Etc.]

In circuit board 200 of the present exemplary embodiment, a plurality of insulator layers 200B and a plurality of conductor layers 200A are alternately provided.

Ground bridges 251 are provided, of the plurality of conductor layers 200A, in conductor layers 200A-1, 200A-4 (one example of at least one predetermined conductor layer).

In this way, ground bridges 251 are provided in predetermined conductor layers. This can suppress conduction of the heat caused in circuit unit 301 on circuit board 200 to housing 110 and occurrence (increase) of electromagnetic noise due to circuit unit 301 while balancing them.

Note that in each of FIG. 7 and FIG. 8, an example is shown, in which the circuit board has three insulator layers 200B-1, 200B-2, 200B-3, and four conductor layers 200A-1, 200A-2, 200A-3, 200A-4. However, this is one example, and in the present disclosure, a number of the insulator layers or the conductor layers may be larger or smaller than this. Also in this case, the layer in which the ground bridge is to be provided is not the conductor layer forming one surface of the circuit board or the conductor layer forming the other surface of the circuit board, but may be another layer, as described above. Additionally, a number of layers to be provided with the ground bridges may be set appropriately in consideration of the balance between suppression of conduction of the heat caused in a predetermined circuit unit on the circuit board to the housing and suppression of occurrence (increase) of electromagnetic noise.

Third Exemplary Embodiment

A third exemplary embodiment will be described focusing on differences from the first exemplary embodiment.

[3-1. Configuration, Etc.]

Figure 9:
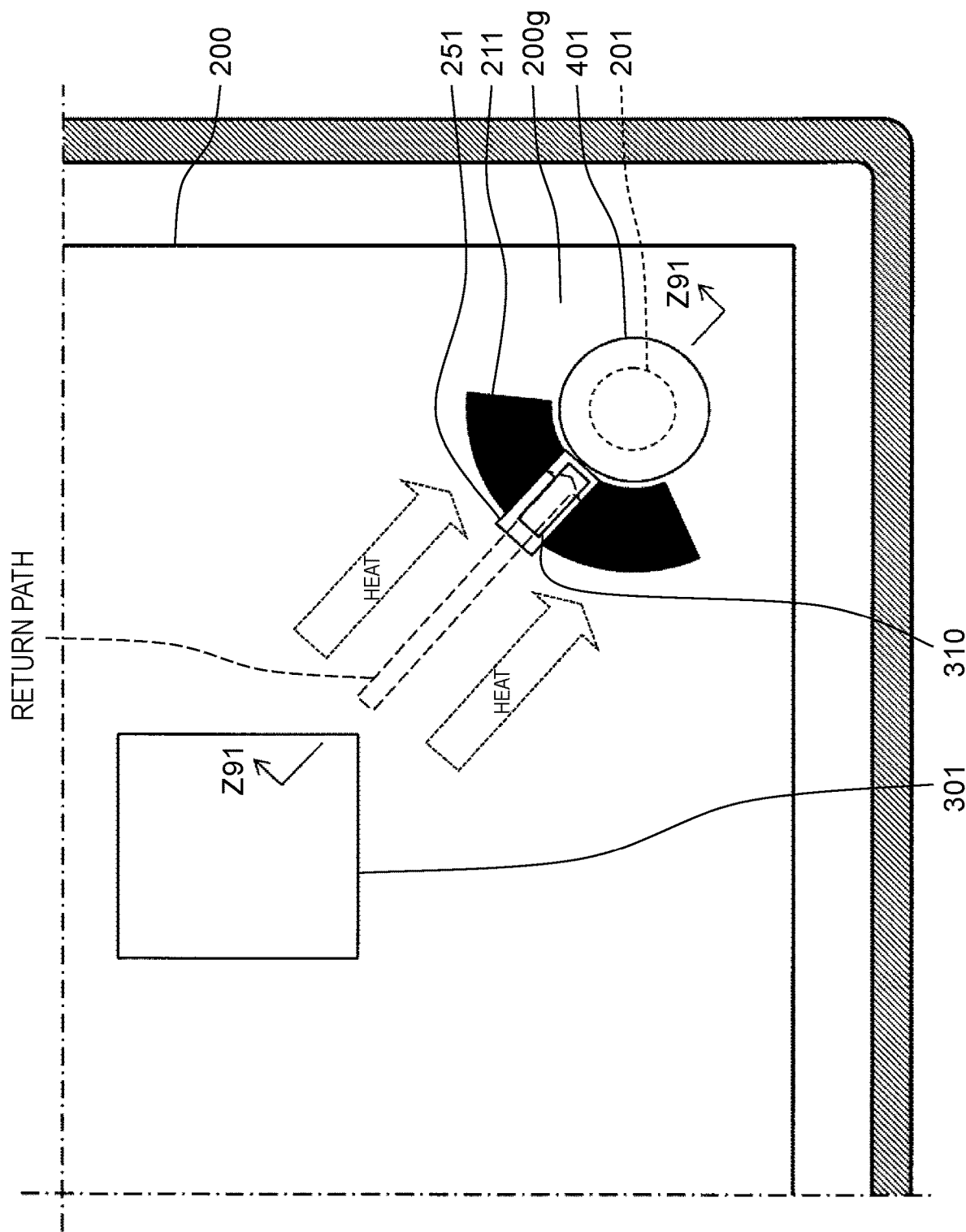
FIG. 9 is a plan view of a computer including a circuit board according to a third exemplary embodiment, the view corresponding to FIG. 3.
Figure 10:
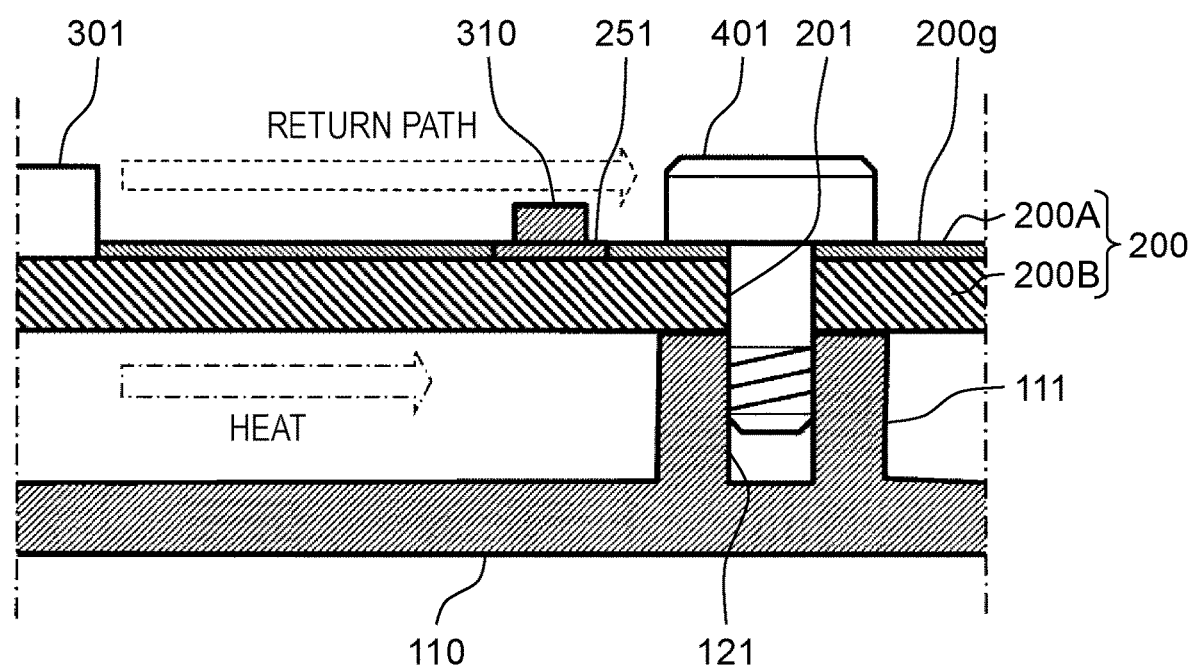
FIG. 10 is a sectional view taken along line Z91-Z91 in FIG. 9.

FIG. 9 is a plan view of a computer including a circuit board according to the third exemplary embodiment, the view corresponding to FIG. 3. FIG. 10 is a sectional view taken along line Z91-Z91 in FIG. 9.

In circuit board 200 according to the third exemplary embodiment, resistor component 310 is arranged on ground bridge 251 in addition to the configuration of the first exemplary embodiment. Other configurations are the same as those in the first exemplary embodiment. The resistance of resistor component 310 is 0Ω. According to the present exemplary embodiment, resistor component 310 can be installed by using ground bridge 251. Further, the resistance of a portion of ground bridge 251, the portion serving as a return path for the ground current, can be further reduced.

[3-2. Effects, Etc.]

Circuit board 200 of the present exemplary embodiment has resistor component 310 disposed on ground bridge 251.

Thereby, resistor component 310 can be installed by using ground bridge 251. Further, the resistance of a portion of ground bridge 251, the portion serving as a return path for the ground current, can be further reduced.

Fourth Exemplary Embodiment

A fourth exemplary embodiment will be described focusing on differences from the first exemplary embodiment.

[4-1. Configuration, Etc.]

Figure 11:
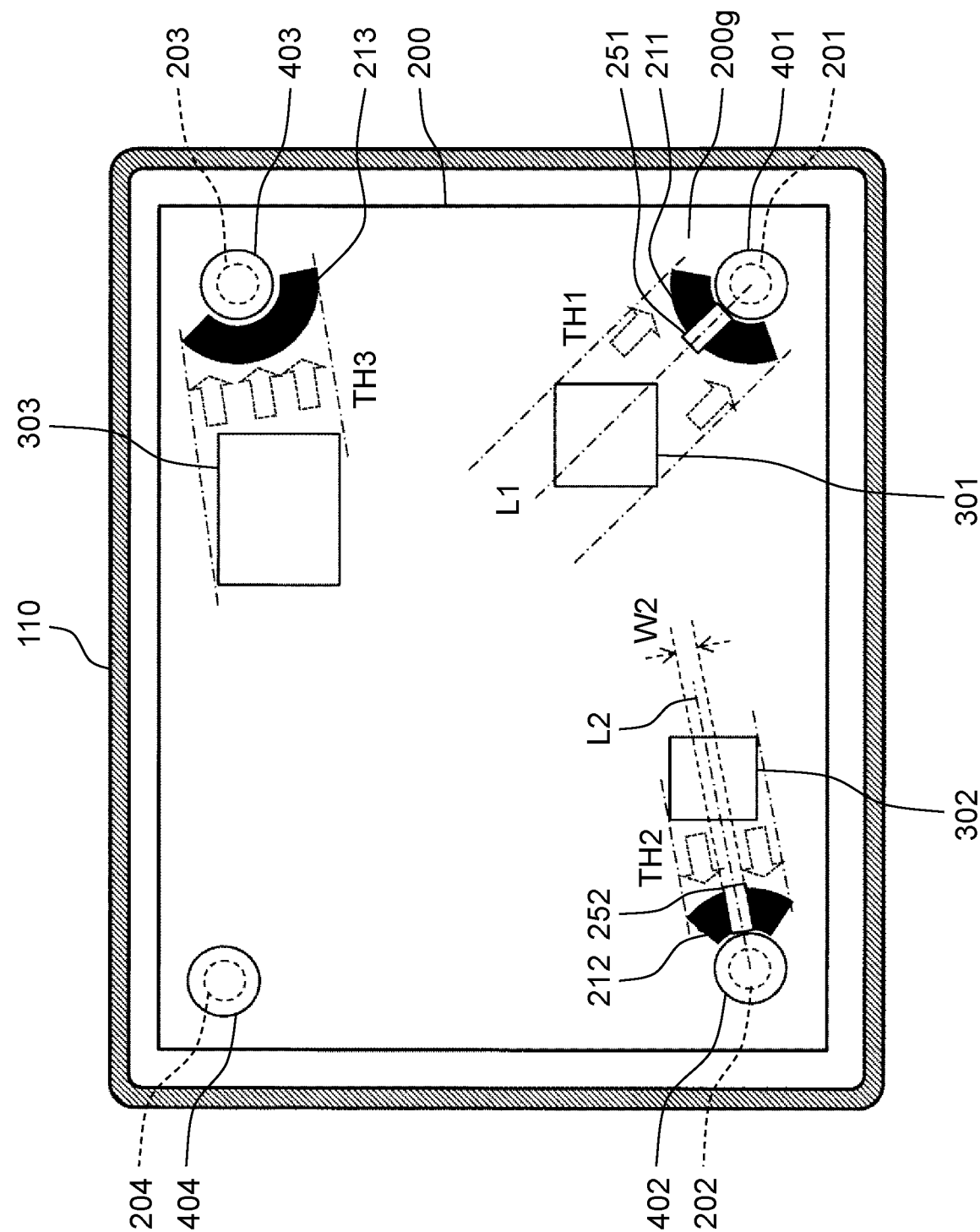
FIG. 11 is a plan view of a computer according to a fourth exemplary embodiment, the view corresponding to FIG. 2.

FIG. 11 is a plan view of computer 100 according to the fourth exemplary embodiment, the view corresponding to FIG. 2.

In the first to third exemplary embodiments, it has been described that, of circuit units 301, 302, 303, only circuit unit 301 causes a relatively large amount of heat during its operation. In the fourth exemplary embodiment, a case will be described in which not only circuit unit 301 but also circuit units 302, 303 cause relatively large amounts of heat during their operations. In this case, slits 212, 213 are also provided around screw insertion holes 202, 203 for screws 402, 403 near circuit units 302, 303.

Similar to the first exemplary embodiment, an angular range of the arc of slit 212 is set based on arrival path TH2 for heat from circuit unit 302 to screw insertion hole 202 so as to block heat conduction from circuit unit 302 to screw insertion hole 202 via ground portion 200g.

An angular range of the arc of slit 213 is set based on arrival path TH3 for heat from circuit unit 303 to screw insertion hole 203 so as to block heat conduction from circuit unit 303 to screw insertion hole 203 via ground portion 200g.

Also, in the fourth exemplary embodiment, it is assumed that not only circuit unit 301 but also circuit unit 302 is a component being a source that causes a relatively large level of electromagnetic noise during its operation. In this case, slit 212 is also provided with ground bridge 252.

Ground bridge 252 is provided on virtual line L2 that connects circuit unit 302 and screw insertion hole 202. Thereby, a ground current of circuit unit 302 can reach screw 402 via ground bridge 252 without bypassing slit 212. That is, a return path for the ground current of circuit unit 302 can be shortened. Therefore, occurrence (increase) of electromagnetic noise due to circuit unit 302 can be appropriately suppressed even when slit 212 is provided.

Width W2 of ground bridge 252 is set to be as small as possible within a range in which the electromagnetic noise in the MHz band caused by circuit unit 302 is suppressed by a certain amount. The reason why width W2 is set to be as small as possible in this way is because heat conduction to screw 402 via ground bridge 252 is suppressed as much as possible. In order to suppress the electromagnetic noise in the MHz band, the width of ground bridge 252 is set to, for example, about 1 mm.

Other Exemplary Embodiments

As described above, the first to fourth exemplary embodiments have been described as examples of the technology disclosed in the present application. However, the technology in the present disclosure is not limited thereto, and can be applied to exemplary embodiments in which modifications, replacements, additions, omissions, etc. are appropriately made. It is also possible to make a new exemplary embodiment by combining the respective constituent elements described in the first to fourth exemplary embodiments. So, other exemplary embodiments will be illustrated below.

(1) In the above exemplary embodiments, the case where the circuit board according to the present disclosure is applied to an electronic device has been described. However, the circuit board according to the present disclosure can be applied not only to electronic devices, but also to various devices including a circuit board on which components each becoming a source that causes heat and electromagnetic noise are disposed.

(2) In the above exemplary embodiments, the case where the electronic device according to the present disclosure is applied to a tablet computer has been described. However, the electronic device of the present disclosure can be applied not only to tablet computers, but also to various electronic devices, including notebook computers, smartphones, Blu-ray recorders, portable game devices, digital cameras, etc., each of which includes a circuit board on which electronic components, etc., each becoming a source that causes heat and electromagnetic noise are mounted.

(3) In the above-described exemplary embodiments, an example in which one ground bridge is provided for one slit has been described. However, there may be a case where two or more predetermined circuit units exist around one slit for one screw insertion hole. In this case, ground bridges whose number is according to a number of predetermined circuit units may be provided for one slit. Each ground bridge may be provided, for example, on a virtual line that connects each predetermined circuit unit and the screw insertion hole.

(4) In the above exemplary embodiments, the ground bridge has a linear shape. However, in the present disclosure, the ground bridge may have any shape such as a curved shape, an L shape, or a Z shape, instead of the linear shape. Additionally, in the above exemplary embodiments, the ground bridge passes near the center in the circumferential direction of the arc-shaped slit, but it may be provided to be biased to either side in the circumferential direction of the arc-shaped slit, depending on the positional relationship with the predetermined circuit unit or the amount of the heat caused.

(5) In the above exemplary embodiments, an example has been shown, in which the screw insertion holes are provided near the four corners of the circuit board having a rectangular shape. In the present disclosure, however, the shape of the circuit board and the positions of the screw insertion holes are arbitrary. In that case, the slit and the ground bridge may be provided for, for example, the screw insertion hole closest to the predetermined circuit unit.

As described above, the exemplary embodiments have been described as examples of the technology in the present disclosure. To that end, the accompanying drawings and detailed description have been provided. Therefore, among the constituent elements described in the accompanying drawings and the detailed description, not only constituent elements that are essential for solving the problem, but also constituent elements that are not essential for solving the problem may be included in order to illustrate the above technology. Therefore, it should not be immediately recognized that these non-essential constituent elements are essential based on the fact that the non-essential constituent elements are described in the accompanying drawings and the detailed description. Additionally, since the above-described exemplary embodiments are for illustrating the technology in the present disclosure, various modifications, replacements, additions, omissions, etc., can be made within the scope of the claims or equivalents thereof.

INDUSTRIAL APPLICABILITY

The present disclosure can be widely used in devices including a circuit board on which components each becoming a source that causes heat and electromagnetic noise are disposed.

REFERENCE MARKS IN THE DRAWINGS

100: computer
110: housing
111: boss
121: screw hole
120: display unit
200: circuit board
200A: conductor layer
200A-1: conductor layer
200A-2: conductor layer
200A-3: conductor layer
200A-4: conductor layer
200B: insulator layer
200B-1: insulator layer
200B-2: insulator layer
200B-3: insulator layer
20$g$: ground portion
200$ga$: portion
200$gb$: portion
201: screw insertion hole
202: screw insertion hole
203: screw insertion hole
204: screw insertion hole
211: slit
212: slit
213: slit
251: ground bridge
252: ground bridge
301: circuit unit
302: circuit unit
303: circuit unit
310: resistor component
401: screw
402: screw
403: screw
404: screw

The invention claimed is:

1. A circuit board in which a predetermined circuit unit that causes heat and electromagnetic noise is disposed, and which is to be fixed to a conductive housing with a conductive screw, the circuit board comprising:
   a plurality of insulator layers each including an insulating plate-shaped base material;
   three or more conductor layers alternately provided with the plurality of insulator layers, the three or more conductor layers including a first conductor layer that forms a first surface of the circuit board, a second conductor layer that forms a second surface of the circuit board opposite the first surface, and at least one intermediate conductor layer, each of the three or more conductor layers has a respective circuit pattern including a ground portion; and
   a screw insertion hole that penetrates the plurality of insulator layers and the ground portion of each of the three or more conductor layers, and through which the conductive screw is to be inserted,
   wherein
   the ground portion of each of the three or more conductor layers has a slit disposed between the screw insertion hole and the predetermined circuit unit, and
   the ground portion of only the first conductive layer and the second conductive layer has a ground bridge that electrically connects (i) a portion of the ground portion between the respective slit and the screw insertion hole, and (ii) a portion of the ground portion between the slit and the predetermined circuit unit.

2. The circuit board according to claim 1, wherein the ground bridge of each ground portion of the first conductive layer and the second conductive layer is provided on a virtual line that connects the predetermined circuit unit and the screw insertion hole.

3. The circuit board according to claim 1, further comprising a resistor component disposed on the ground bridge of at least one of the ground portions of the first conductive layer and the second conductive layer.

4. The circuit board according to claim 1, wherein
the slit of the ground portion of each of the three or more conductor layers has an arc shape centered on a center of the screw insertion hole, and
an angular range of the arc shape is set based on a conduction path for the heat from the predetermined circuit unit to the screw insertion hole so as to block the heat from being conducted to the screw insertion hole via the ground portion.

5. The circuit board according to claim 1, wherein the predetermined circuit unit is an arithmetic processing circuit.

6. The circuit board according to claim 1, wherein the predetermined circuit unit is a power supply circuit.

7. The circuit board according to claim 1, wherein a width of the ground bridge of the ground portion of at least one of the first conductive layer and the second conductive layer is smaller than a diameter of the screw insertion hole.

8. An electronic device comprising:
the circuit board according to claim 1; and
the conductive housing.

9. A circuit board in which a predetermined circuit unit that causes heat and electromagnetic noise is disposed, and which is to be fixed to a conductive housing with a conductive screw, the circuit board comprising:
a plurality of insulator layers each including an insulating plate-shaped base material;
three or more conductor layers alternately provided with the plurality of insulator layers, the three or more conductor layers including a first conductor layer that forms a first surface of the circuit board, a second conductor layer that forms a second surface of the circuit board opposite the first surface, and at least one intermediate conductor layer, each of the three or more conductor layers has a respective circuit pattern including a ground portion; and
a screw insertion hole that penetrates the plurality of insulator layers and the ground portion of each of the three or more conductor layers, and through which the conductive screw is to be inserted;
wherein
the ground portion of each of the three or more conductor layers has a slit disposed between the screw insertion hole and the predetermined circuit unit; and
the ground portion of at least one of the first conductive layer and the second conductive layer has a ground bridge that electrically connects (i) a portion of the ground portion between the respective slit and the screw insertion hole, and (ii) a portion of the ground portion between the slit and the predetermined circuit unit.

10. The circuit board according to claim 9, wherein the ground bridge of each ground portion of the first conductive layer and the second conductive layer is provided on a virtual line that connects the predetermined circuit unit and the screw insertion hole.

11. The circuit board according to claim 9, further comprising a resistor component disposed on the ground bridge of at least one of the ground portions of the first conductive layer and the second conductive layer.

12. The circuit board according to claim 9, wherein
the slit of the ground portion of each of the three or more conductor layers has an arc shape centered on a center of the screw insertion hole, and
an angular range of the arc shape is set based on a conduction path for the heat from the predetermined circuit unit to the screw insertion hole so as to block the heat from being conducted to the screw insertion hole via the ground portion.

13. The circuit board according to claim 9, wherein the predetermined circuit unit is an arithmetic processing circuit.

14. The circuit board according to claim 9, wherein the predetermined circuit unit is a power supply circuit.

15. The circuit board according to claim 9, wherein a width of the ground bridge of the ground portion of at least one of the first conductive layer and the second conductive layer is smaller than a diameter of the screw insertion hole.

16. An electronic device comprising:
the circuit board according to claim 9; and
the conductive housing.

* * * * *